(12) United States Patent
Satoh

(10) Patent No.: US 6,929,821 B2
(45) Date of Patent: Aug. 16, 2005

(54) PROCESS FOR FORMING A PATTERN OF FLUORESCENT SUBSTRATE AND PLASMA DISPLAY PANEL

(75) Inventor: Hiroaki Satoh, Ibaraki (JP)

(73) Assignee: The Nippon Synthetic Chemical Industry Co., Ltd., Osaka (JP)

( * ) Notice: Subject to any disclaimer, the term of this patent is extended or adjusted under 35 U.S.C. 154(b) by 138 days.

(21) Appl. No.: 09/271,447

(22) Filed: Mar. 18, 1999

(65) Prior Publication Data

US 2002/0106446 A1 Aug. 8, 2002

(30) Foreign Application Priority Data

| Mar. 18, 1998 | (JP) | 10-091005 |
| Mar. 18, 1998 | (JP) | 10-091006 |
| Mar. 18, 1998 | (JP) | 10-091007 |

(51) Int. Cl.[7] .............................. B05D 5/06; B05D 5/12; G03C 1/00
(52) U.S. Cl. .............................. 427/66; 427/68; 430/25; 430/26; 430/28
(58) Field of Search ........................ 427/66, 68; 430/25, 430/26, 28

(56) References Cited

U.S. PATENT DOCUMENTS

| 4,239,849 A | * | 12/1980 | Lipson et al. | 430/281.1 |
| 4,842,987 A | * | 6/1989 | Elzer et al. | 204/157.15 |
| 5,371,148 A | * | 12/1994 | Taylor et al. | 525/293 |
| 5,459,174 A | * | 10/1995 | Merrill et al. | 522/35 |
| 5,827,757 A | * | 10/1998 | Robinson et al. | 438/66 |
| 5,858,616 A | * | 1/1999 | Tanaka et al. | 430/281.1 |
| 5,922,395 A | * | 7/1999 | Koike et al. | 427/68 |
| 6,329,111 B1 | * | 12/2001 | Nojiri et al. | 156/100 |
| 6,333,134 B1 | * | 12/2001 | Taguchi et al. | 430/270.1 |

FOREIGN PATENT DOCUMENTS

| JP | 6-273925 | 9/1994 |
| JP | 9-69339 | 3/1997 |
| JP | 9-199027 | 7/1997 |
| JP | 9-199030 | 7/1997 |

* cited by examiner

Primary Examiner—Michael Cleveland
(74) Attorney, Agent, or Firm—Leydig, Voit & Mayer, Ltd.

(57) ABSTRACT

A resin composition (A) layer, comprising an acrylic polymer (a) having a weight average molecular weight of 10000 to 300000 and an acid number of 80 to 250 mgKOH/g and a fluorescent substance (b), and a photosensitive resin composition (B) layer are formed inside the cell, and then they are exposed, developed and baked. By the process of the present invention the fluorescent substance can be effectively and uniformly formed on the side and bottom wall of the cell.

3 Claims, 1 Drawing Sheet

PROCESS FOR FORMING A PATTERN OF FLUORESCENT SUBSTRATE AND PLASMA DISPLAY PANEL

BACKGROUND OF THE INVENTION

The present invention relates to a process for forming a pattern of fluorescent substance into the cell in the process of producing a fluorescent substance display device such as a plasma display panel (hereinafter referred to as "PDP").

Recently various flat display panels have been developed strongly. Among those, PDP has attracted considerable attention. The PDP has been used largely for a display panel of a laptop personal computer, various electric score boards, and a so-called "wall-hanging television".

Inside the cell of display panel of PDP, a fluorescent substance for displaying was sealed and fixed, the fluorescent substance emits color by ultraviolet lights generated in a gas sealed inside the cell by adding voltage.

As a process for forming a pattern of fluorescent substance, there has been employed a liquid photo resist containing dispersed fluorescent substances having each color. In order to improve the process for formation, the present inventor proposed a dry film resist (photo resist film) containing a fluorescent substance instead of the liquid photo resist (Japanese Unexamined Patent Publication No.273925/1994). And in order to improve the fixing efficiency of fluorescent substance, there was provided a process for forming a pattern by using a laminated film of an acrylic resin layer and a photosensitive resin composition layer containing a fluorescent substance (Japanese Unexamined Patent Publication No.69339/1997).

And in order to obtain the accurate and uniform pattern of fluorescent substance, there were proposed a process that the photosensitive thermoplastic resin layer was glued on the photosensitive resin composition layer by heating and pressing, and then it was exposed, developed and baked (Japanese Unexamined Patent Publication No.199027/1997), and a process that a photosensitive element, which contains a photosensitive thermoplastic resin layer on a supporting film and a photosensitive resin composition layer containing a fluorescent substance thereon, was glued by heating and pressing in contact with the photosensitive resin composition layer containing a fluorescent substance on the PDP substrate, and then it was exposed, developed and baked (Japanese Unexamined Patent Publication No.199030/1997).

SUMMARY OF THE INVENTION

However, in the photo resist film described in Japanese Unexamined Patent Publication No. 273925/1994, there was not sufficiently investigated filling of fluorescent substance into the cell. On the other hand, in the process considering the film described in Japanese Unexamined Patent Publication No. 69339/1997, the filling amount of fluorescent substance into the cell was secured, but the fluorescent substance was not fixed uniformly and efficiently in a side and bottom wall of the cell (filling up property), since the photosensitive resin composition layer was laminated after forming the acrylic resin layer containing no fluorescent substance.

And in the processes described in Japanese Unexamined Patent Publication Nos.199027/1997 and 199030/1997, the filling up property was comparatively well since the layer containing a fluorescent substance was formed on the side wall of the cell. But possibility of pattern defects at baking was high since the layer containing a fluorescent substance was given photo polymerization.

Under these circumstances, it is an object of the present invention to form the pattern of fluorescent substance uniformly in order to effectively emit the fluorescent substance filled in the cell and not to form pattern defects on the side and bottom wall of the cell at baking mentioned above. And the secondarily economical effect can be expected, in which an amount of fluorescent substance can be decreased due to realization of forming such pattern of fluorescent substance.

Namely, the present invention relates to a process for forming a pattern of fluorescent substance into the cell of a fluorescent substance display substrate, wherein a resin composition (A) layer, comprising an acrylic polymer (a) having a weight average molecular weight of 10000 to 300000 and an acid number of 80 to 250 mgKOH/g and a fluorescent substance (b) and a photosensitive resin composition (B) layer are formed inside the cell, and then they are exposed, developed and baked. By the present invention a pattern of fluorescent substance is effectively formed since the composition follows sufficiently on the side and bottom wall of the cell (excellent filling up property).

DETAILED DESCRIPTION

Figure 1A:
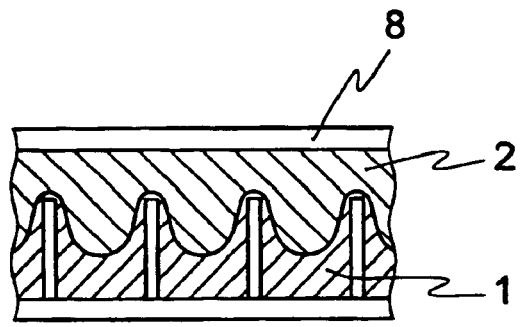
FIGS. 1(a)–1(d) show an explanatory drawing which expresses a process for forming a pattern of fluorescent substance of PDP by the present invention of the process for forming a pattern of fluorescent substance.

As the resin composition (A) layer employed in the present invention, there is used the resin composition (A) comprising an acrylic polymer (a) and a fluorescent substance (b).

A glass transition temperature Tg of the acrylic polymer (a) is preferably less than 30° C., more preferably less than 25° C. From the viewpoint of fluidity and storing stability. If Tg is not less than 30° C., sufficient fluidity is not obtained at lamination and flowing property tends to be bad.

On the other hand, even if an acrylic polymer having Tg of not less than 30° C., the fluidity is improved by adding an organic compound (c) mentioned below and the poor flowing property is also improved. In this case Tg is preferably 40 to 200° C., more preferably 45 to 175° C.

And an acrylic copolymer and an acrylic copolymer containing an acetoacetyl group can be also employed, in which (meth)acrylate is a main component and which is co-polymerized with an ethylenically unsaturated carboxylic acid and the other co-polymerizable monomers if necessary.

Examples of the (meth)acrylate are methyl (meth)acrylate, ethyl (meth)acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, dimethylaminoethyl (meth)acrylate, hydroxyethyl (meth)acrylate, hydroxypropyl (meth)acrylate, gricidyl (meth)acrylate and the like.

Examples of the ethylenicaly unsaturated carboxylic acid are a mono carboxylic acid such as acrylic acid, methacrylic acid and crotonic acid, a dicarboxylic acid such as maleic acid, fumaric acid and itaconic acid, an acid anhydride thereof and a half ester thereof. Among those, acrylic acid and methacrylic acid are more preferable.

Examples of the other co-polymerizable monomer are acrylamide, methacrylamide, acrylonitrile, styrene, α-methylstyrene, vinyl acetate, alkyl vinyl ether and the like.

The acrylic polymer (a) has preferably a weight average molecular weight of 10000 to 300000 and an acid number of 80 to 250 mgKOH/g. It has more preferably a weight average molecular weight of 30000 to 200000 and an acid number of 95 to 175 mgKOH/g. If the weight average molecular weight is below 10000, maintaining property of film becomes insufficient. If the weight average molecular weight is above 300000, developing property becomes low. And if the acid number is below 80 mgKOH/g, developing property becomes low. If the acid number is above 250 mg/KOH/g, resistance for developer becomes low.

The fluorescent substance (b) employed in the present invention can be employed without particular limitation, the substrate is preferable, in which the nuclei thereof is a rare earth metal oxyhalide and the nuclei is activated by an activating agent. Examples of the fluorescent substance, which is excited by a ultraviolet light, are $Y_2O_3$:Eu, $YVO_4$:Eu, $(Y,Gd)BO_3$:Eu (red); $BaAl_{12}O_{19}$:Mn, $Zn_2SiO_4$:Mn, $LaPO_4$:Tb (green); $BaMgAl_{14}O_{23}$:Eu, $BaMgAl_{16}O_{27}$:Eu (blue) and the like. The other examples thereof are $Y_2O_3S$:Eu, $\gamma$-$Zn_3(PO_4)_2$:Mn, $(ZnCd)S$:Ag+$In_2O_3$ (red); ZnS:Cu,Al, ZnS:Au,Cu,Al, (ZnCd)S:Cu,Al, $Zn_2SiO_4$:Mn,As, $Y_3Al_5O_{12}$:Ce, $Gd_2O_2S$:Tb, $Y_3Al_5O_{12}$:Tb, ZnO:Zn (green); ZnS:Ag+red dye, $Y_2SiO_3$:Ce (blue) and the like.

The amount of the fluorescent substance (b) is preferably 1 to 1500 parts by weight, more preferably 10 to 800 parts by weight based on 100 parts by weight of the acrylic polymer (a). If the amount is below 1 part by weight, brightness becomes low for the lack of the amount of the fluorescent substance after forming a pattern. If the amount is above 1500 parts by weight, flexibility becomes low.

As a process of mixing the fluorescent substance (b), the conventional processes can be employed without particular limitation. Examples thereof are a process that the fluorescent substance (b) is uniformly dispersed by adding the pre-determined amount of the fluorescent substance (b) to the acrylic polymer (a) and mixing sufficiently, and the like.

Examples of the organic compound (c) employed in the present invention having viscosity of 5 to 15000 mPa·sec at 20° C. are, for instance, a polyhydric alcohol compound, a compound containing at least one ethylenically unsaturated group, and the like.

The polyhydric alcohol compound (c) can be employed without particular limitation, examples thereof are, for instance, polyethylene glycol, polypropylene glycol, the compound represented by the following formula (I) and the like.

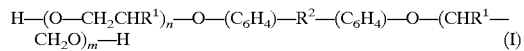

(wherein $R^1$ represents a hydrogen atom or a methyl group, $R^2$ represents —$CH_2$—, —$C(CH_3)_2$— or —S—, n and m are a positive integer, and n+m is 2 to 60).

The amount of the polyhydric alcohol compound is preferably 50 to 300 parts by weight, more preferably 100 to 250 parts by weight based on 100 parts by weight of the acrylic polymer (a). If the amount is below 50 parts by weight, flexibility becomes low. If the amount is above 300 parts by weight, storing property, such as cold flow and cohesion of the fluorescent substance, becomes low.

The ethylenically unsaturated compound (c) can be employed without particular limitation. Examples thereof are polyethylene glycol di(meth)acrylate, polypropylene glycol di(meth)acrylate, bisphenol-A di(meth)acrylate modified with ethylene oxide, glycerin triacrylate, glycerin triacrylate modified with propylene oxide (PO) and the like. Among those, polypropylene glycol di(meth)acrylate, bisphenol-A di(meth)acrylate modified with ethylene oxide, glycerin triacrylate, glycerin triacrylate modified with propylene oxide (PO) are preferable.

The amount of the ethylenically unsaturated compound is preferably 50 to 300 parts by weight, more preferably 100 to 250 parts by weight based on 100 parts by weight of the acrylic polymer (a). If the amount is below 50 parts by weight, flexibility becomes low. If the amount is above 300 parts by weight, storing property, such as cold flow and cohesion of fluorescent substance, becomes low.

In case of employing the ethylenically unsaturated compound, it is necessary to employ the polymerization inhibitor (d) mentioned below.

The viscosity of the polyhydric alcohol compound or the ethylenically unsaturated compound at 20° C. is preferably 5 to 15000 mPa·sec, more preferably 20 to 10000 mPa·sec, particularly 50 to 10000 mPa·sec. If the viscosity is below 5 mPa·sec, the compound is sometimes separated due to migration at storing. If the viscosity is above 15000 mPa·sec, it becomes difficult to mix the fluorescent substance uniformly.

The photo polymerization inhibitor (d) employed in the present invention can be employed without particular limitation, example thereof are 2,2'-methylene bis(4-methyl-6-tert-butyl)phenol, quinones such as p-methoxyhydroquinone, thiuram disulfide and the like.

The amount of the photo polymerization inhibitor (d) is preferably 0.1 to 15 parts by weight, more preferably 0.2 to 10 parts by weight based on 100 parts by weight of the acrylic polymer (a). If the amount is below 0.1 part by weight, satisfactory pattern of fluorescent substance can not be obtained at baking due to the photo setting at the migration of the photo polymerization initiator from the photosensitive resin composition (B). On the other hand, if the amount is above 15 parts by weight, plasticity increases, coloration and insufficient baking occurs.

In case of employing the ethylenically unsaturated compound as an organic compound (c), it is necessary to employ the polymerization inhibitor (d). On the other hand, in case of employing the polyhydric alcohol compound, the polymerization inhibitor (d) may be suitably employed, if necessary.

The photo polymerization initiator and/or the photo polymerization initiator assistant can be employed in the present invention, if necessary. As the photo polymerization initiator and/or the photo polymerization initiator assistant (e) employed in the present invention, example thereof are, for instance, benzoin, benzoin methyl ether, benzoin ethyl ether, benzoin isopropyl ether, benzoin n-butyl ether, benzoin phenyl ether, benzyl diphenyl disulfide, benzyl dimethyl ketal, dibenzyl, diacetyl, anthraquinone, naphthoquinone, 3,3'-dimethyl-4-methoxybenzophenone, benzophenone, 4,4'-bis(dimethylamino)benzophenone, 4,4'-bis(diethylamino)benzophenone, pivaloin ethyl ether, 1,1-dichloroacetophenone, p-t-butyldichloroacetophenone, hexaaryl imidazole dimer such as 2,2'-bis(o-chlorophenyl)-4,5,4',5'-tetraphenyl-1,2'-biimidazole, 2-chlorothioxanthone, 2-methylthioxanthone, 2,4-diethylthioxanthone, 2,2'-diethoxyacetophenone, 2,2'dimethoxy-2-phenylacetophenone, 2,2'-dichloro-4-phenoxyacetophenone, phenylglyoxylate, α-hydroxyisobutylphenone, dibenzosparone, 1-(4-isopropylphenyl)-2-hydroxy-2-methyl-1-propanone, 2-methyl-[4-(methylthio)phenyl]-2-morpholio-1-propanone, tribromophenylsulfone, tribromomethylphenylsulfone and the like.

The amount of the photo polymerization initiator and/or the photo polymerization initiator assistant (e) is preferably 0.1 to 20 parts by weight, more preferably 0.2 to 10 parts by weight based on 100 parts by weight of the base polymer (c) and the ethylenically unsaturated compound (d). If the amount is below 0.1 part by weight, sensitivity becomes remarkably low. If the amount is above 20 parts by weight, plasticity increases and stability of storing becomes low.

As the photosensitive resin composition (B) layer, the resin composition, which is photosensitive, can be employed without particular limitation. The resin composition preferably comprises a base polymer (f), an ethylenically unsaturated compound (g) and a photo polymerization initiator (h).

As the base polymer (f), there may be suitably employed a polyester resin, a polyurethane resin, an acrylic copolymer same as the above-mentioned acrylic polymer (a) which is co-polymerized with a (meth)acrylate component, if necessary, an ethylenically unsaturated carboxylic acid and the other co-polymerizable monomer. The base polymer (f) and the acrylic polymer (a) may be same or different.

The glass transition temperature of the base polymer (f) is preferably not less than 30° C., more preferably 45 to 175° C. The weight average molecular weight thereof is preferably 10000 to 300000, more preferably 30000 to 200000. And the photosensitive resin composition (B) may be the dilute-alkali developing type. If the composition is the dilute-alkali developing type, it is necessary to co-polymerize 15 to 40% by weight of the ethylenically unsaturated carboxylic acid and to suitably employ the base polymer having an acid number of 65 to 310 mgKOH/g, more preferably 95 to 220 mgKOH/g.

Examples of the ethylenically unsaturated compound (g) are monomers having multi functional groups such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerin di(meth)acrylate, pentaerythritol di(meth)acrylate, pentaerythritol tri(meth)acrylate, dipentaerythritol penta(meth)acrylate, 2,2-bis(4-(meth)acryloxydiethoxyphenyl)propane, 2,2-bis-(4-(meth)acryloxypolyethoxyphenyl)propane, 2-hydroxy-3-(meth)acryloyloxypropyl (meth)acrylate, ethylene glycol digricidyl ether di(meth)acrylate, diethylene glycol digricidyl ether di(meth)acrylate, digricidyl phthalate di(meth)acrylate, glycerin triacrylate, and glycerin polygricidyl ether poly(meth)acrylate.

A suitable amount of a monomer having mono functional group can be employed with these monomers having multi functional groups. Examples of the monomer having mono functional group are 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, 2-(meth)acryloyloxyethylacidphosphate, a half (meth)acrylate of a phthalic acid derivatives, N-methylol (meth)acrylamide and the like.

The amount of the ethylenically unsaturated compound (g) is preferably 20 to 100 parts by weight, more preferably 30 to 100 parts by weight based on 100 parts by weight of the base polymer (f). If the amount thereof is below 20 parts by weight, setting of the photosensitive resin composition (B) becomes insufficient, the rate of developing becomes long and the plasticity as a layer becomes low. If the amount is above 100 parts by weight, cold flow occurs and the peeling rate of the setting resist of the photosensitive resin composition (B) becomes low.

As the photo polymerization initiator (h), the initiator (e) same as mentioned above can be employed.

The amount of the photo polymerization initiator (h) is preferably 0.1 to 20 parts by weight, more preferably 0.2 to 10 parts by weight based on 100 parts by weight of the base polymer (f) and the unsaturated compound (g). If the amount is below 0.1 part by weight, sensitivity becomes remarkably low. If the amount is above 20 parts by weight, plasticity increases and storing stability becomes low.

To the resin composition (A) containing the fluorescent substance and the photosensitive resin composition (B), there can be suitably added additive agents, for example, a dye (colorant, emission), an adhesion-giving agent, a plasticizer, an antioxidant, a thermal polymerization inhibitor, a solvent, a surface-tension modifiers, a stabilizer, a chain-transferring agent, an antiforming agent, a flame retardant and the like.

The thickness ($T_a$) of the resin composition (A) layer is not determined unconditionally since it depends on an amount of the fluorescent substance (b) and the structure of PDP. But the thickness is preferably thinner than the height ($T_0$) of the side wall of the cell. Further, $T_a(\mu m)$ and $T_0(\mu m)$ are preferably 1/20 to 10/20 of $T_a(\mu m)/T_0(\mu m)$, more preferably 1/20 to 10/20. If $T_a/T_0$ is below 1/20, the thickness of the fluorescent substance after baking becomes insufficient. If $T_a/T_0$ is above 15/20, the space of the cell at discharge electricity becomes small.

The thickness ($T_b$) of the photosensitive resin composition (B) layer is not also determined unconditionally since it depends on the structure of PDP. But the thickness is preferably thinner than the height ($T_0$) of the side wall of the cell. Further, $T_a(\mu m)/T_0(\mu m)$ is preferably 1/20 to 10/20, more preferably 1/20 to 10/20 same as the above-mentioned Ta. If $T_a/T_0$ is below 1/20, it becomes difficult to press the resin composition (A) layer into the cell sufficiently. If $T_a/T_0$ is above 15/20, patterning property becomes low.

In order to form layers by employing the resin composition (A) containing the fluorescent substance and the photosensitive resin composition (B), it is possible to employ the liquid material thereof. But from the viewpoint of dispersion stability of additive, uniformity of applied film thickness, storing stability, following property to the cell and operation condition, it is preferable that the material is previously formed into a film. Concretely, it is preferable that the protecting film such as a polyethylene film or poly(vinylalcohol) film is covered on the application surface after the resin composition (A) and the photosensitive rein composition (B) are applied to the base film such as a polyester film, a polypropylene film and a polystyrene film.

Secondly, the process for forming a pattern of fluorescent substance is explained concretely based on FIGS. 1(a) to (d). Formation of the Resin Composition (A) in the Cell The adhesive strength between the base film (polyester film, polyvinylalcohol film, nylon film, cellulose film etc) and the resin composition (A) layer of the laminate, in which the resin composition (A) layer containing the fluorescent substance is a middle layer, is compared with the adhesive strength between the protecting film and the resin composition (A) layer. After the film having less adhesion is removed, the side of the resin composition (A) layer is pushed into the cell previously formed in the PDP substrate by using a hot laminator to form the resin composition (A) layer 1 in the cell.

Formation of the Resin Composition (B) in the Cell

After removing the film left on the surface of the resin composition (A) layer 1, the laminate, in which the photosensitive resin composition (B) layer 2 is a middle layer, is pushed thereon into the cell by using a hot laminator to form the photosensitive resin composition (B) layer 2 in the cell, in the same manner as in case of the above-mentioned (A) layer 1.

The two layers of the resin composition (A) layer 1 and the photosensitive resin composition (B) layer 2 are laminated and filled in the cell of the PDP substrate. A ratio $T_a/T_b$ of the thickness of (A) layer ($T_a$) to (B) layer ($T_b$) is preferably 10/90 to 75/25.

Except the above-mentioned processes, the resin composition (A) layer 1 and the photosensitive resin composition (B) layer 2 is previously laminated, then the side of the (A) layer of the laminate ((A) layer/(B) layer/base film) is attached to the PDP substrate having the cell previously formed, and the laminate can be pushed into the cell by using a hot laminator.

Thereby the resin composition layer 1 and the photosensitive resin composition (B) layer 2 are formed (See FIG. 1(a)). In FIG. 1(a), a base film or a protecting film 8 is on the photosensitive resin composition (B) layer 2.

Exposure

Figure 1B:
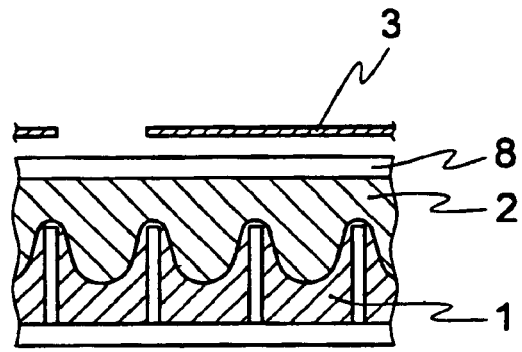

A pattern mask 3 is closely contacted on the photosensitive resin composition (B) layer 2 to expose the composition (See FIG. 1(b)). If the photosensitive resin composition (B) layer 2 is not adhesive, a pattern mask 3 can be directly contacted on the photosensitive resin composition (B) layer 2 to expose the composition on occasion demands after removing the film on the surface of the photosensitive resin composition (B) layer 2. Exposure is usually carried out by radiation of an ultraviolet light. Examples of the light source are a high-pressure mercury lamp, an ultra-high-pressure mercury lamp, a carbon arc lamp, a xenon lamp, a metal halide lamp, a chemical lamp and the like. After irradiation by an ultraviolet light, heat treatment may be applied, if necessary, to ensure the setting.

Development

Figure 1C:
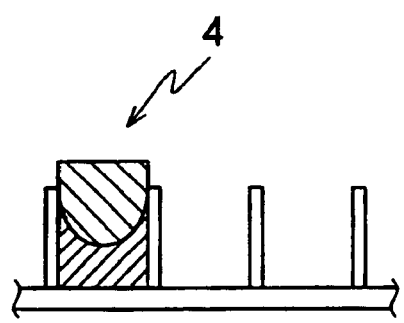

After exposure, the film on the photosensitive resin composition (B) layer 2 is removed, and the layer is developed to form the pattern 4 (See FIG. 1(c)). Since the photosensitive resin composition (B) layer is the photosensitive resin composition of the dilute-alkali developing type, development after exposure is carried out by using 1 to 2% by weight of a dilute alkali aqueous solution such as sodium carbonate and potassium carbonate. In this case, the developer of an organic alkali can be employed.

Baking

Figure 1D:
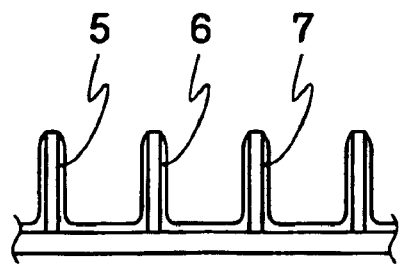

The substrate having formed cell after the above-mentioned treatment is baked at 450 to 550° C., and the fluorescent substance is fixed in the cell to form the pattern 5 of the fluorescent substance (See FIG. 1(d)).

By the process of the present invention, the pattern of the fluorescent substance can be formed in the cell uniformly and perfectly not to form defects at baking. In order to obtain the full color PDP, the processes of Formation of the resin composition (A) in the cell to Development is carried out repeatedly by employing the resin composition (A) layer and the photosensitive resin composition (B) layers containing red, green, blue fluorescent substances. Concretely, baking is carried out after filling the three fluorescent substances (R(red), G(green), B(blue)) into the cell to form the red pattern of fluorescent substance 5, the green pattern of fluorescent substance 6, the blue pattern of fluorescent substance 7 (See FIG. 1(d)).

EXAMPLES

The present invention is further explained in details based on the Examples concretely, but is not limited thereto. "Parts" in Examples means "parts by weight" unless otherwise specified.

Example 1

The resin compositions (A) were prepared by using 70 parts of the following acrylic polymer (a) and 30 parts of the following fluorescent substance (b) (red, green, blue were separately employed).

Resin Composition (A)
Acrylic Polymer (a)
    copolymer of methyl methacrylate, n-butyl acrylate and methacrylic acid, ratio of copolymer 17/62/21 based on weight
      (glass transition temperature 6.5° C., weight average molecular weight 90000, acid number 137 mgKOH/g)

Fluorescent Substance (b)
    (Y, Gd, Eu)BO$_3$ (red)
      (emission wavelength: 593 nm, 610 nm, 626 nm, particle diameter: 2–4 μm, specific gravity: 5.1)
    (Zn, Mn)$_2$SiO$_4$ (green)
      (emission wavelength: 529 nm, particle diameter: 2–6 μm, specific gravity: 4.2)
    (Ba, Eu)MgAl$_{10}$O$_{17}$ (blue)
      (emission wavelength: 451 nm, particle diameter: 2–6 μm, specific gravity: 3.8)

The photosensitive resin composition (B) was prepared by using 60 parts of the following base polymer (f), 40 parts of the following ethylenically unsaturated compound (g) and 10 parts of the following photo polymerization initiator (h).

Photosensitive Resin Composition (B)
Base Polymer (f)
    copolymer of methyl methacrylate, n-butyl methacrylate, 2-ethylhexyl acrylate and methacrylic acid, a ratio of copolymer 50/15/10/25 based on weight
      (glass transition temperature 75° C., weight average molecular weight 60000, acid number 163 mgKOH/g)

| Ethylenically unsaturated compound (g) | |
| --- | --- |
| tetraethylene glycol dimethacrylate | 25 parts |
| trimethylolpropane triacrylate | 15 parts |
| Photo polymerization initiator (h) | |
| benzyl dimethyl ketal | |

The obtained resin composition (A) was applied to a polyester film having 20 μm thickness by using an applicator having 10 mil gap. After standing at a room temperature for one and half minute, the film was dried respectively for 3 minutes at 60, 90, 110° C. to form the resin composition (A) layer having 50 μm Ta (a protecting film was not covered).

In case of the resin composition (A) layer, the layers containing red, green, or blue fluorescent substance were respectively prepared.

The photosensitive resin composition (B) layer having 70 μm Tb was prepared by using the photosensitive resin composition (B) in the same manner as mentioned above (a protecting film was not covered).

By using the obtained laminate of (A) layer and (B) layer, the pattern of the fluorescent substance was formed according to the following process.

Formation of the Resin Composition (A) Layer and the Photosensitive Resin Composition (B) Layer To the PDP substrate (200 mm×200 mm×2 mm) preheated at 60° C. in an oven having the formed cell (stripe pattern of $T_0$ 120 μm, width 45 μm and slit 180 μm), the resin composition (A) layer (laminated film) was laminated at the following condition; temperature of laminate roll 120° C., pressure of roll 3 kg/cm², rate of lamination 0.5 m/min. After removing the polyester film, the photosensitive resin composition (B) layer (laminated film) was laminated thereon in the same manner as mentioned above to form the resin composition (A) layer and the photosensitive resin composition (B) layer.

Exposure, Development

In order to expose the inside of the cell (except for the upper part of the cell), pattern was put on the polyester film on the surface of the photosensitive resin composition (B) layer, and the film was exposed by using a 3 kw ultra-high-pressure mercury lamp of exposing machine HMW-523D made by Ork Manufacturing Co.,Ltd. The exposure value was the value of step 7 measured by a stopher 21 step sensitivity guide.

After holding time of 15 minutes after exposure, the film was developed with 1% by weight sodium carbonate aqueous solution at 30° C. for twice time of the minimum developing time to form a red line. And repeating the same operations, a green line and a blue line were formed.

Baking

Putting into the baking bath after development, the resin component of the resin composition (A) layer and the photosensitive resin composition (B) layer were baked at 550° C. to form the patterns of the red, green, blue fluorescent substances.

The obtained cell substrate having the formed pattern of fluorescent substance had no defect of pattern made by baking, and it was found by observing a cross section of the cell with SEM (Scanning Electron Microscope) that the fluorescent substance was formed effectively and uniformly from the upper to the bottom part of the wall.

Example 2

The pattern of the fluorescent substance was formed by the same manner as in Example 1 except for changing the composition of the acrylic polymer in the resin composition (A) to the following composition.

The obtained cell substrate having the formed pattern of fluorescent substance had no defect of pattern made by baking, and the fluorescent substance was formed effectively and uniformly from the upper to the bottom part of the wall same as in Example 1.

Acrylic Polymer (a)
  copolymer of n-butyl acrylate, n-butyl methacrylate and methacrylic acid, a ratio of copolymer 45/30/25 based on weight
    (glass transition temperature 12.6° C., weight average molecular weight 120000, acid number 162.7 mgKOH/g)

Comparative Example 1

The pattern of the fluorescent substance was formed in the same manner as in Example 1 except for changing the composition of the acrylic polymer in the resin composition (A) to the following composition.

Acrylic Polymer (a)
  copolymer of methyl methacrylate, n-butyl acrylate and methacrylic acid, a ratio of copolymer 50/20/30 based on weight
    (glass transition temperature 79.6° C., weight average molecular weight 90000, acid number 195.3 mgKOH/g)

The obtained cell substrate having the formed pattern of fluorescent substance did not give an excellent result since it formed defects due to poor following property.

Example 3

The resin composition (A) was prepared by using 50 parts of the following acrylic polymer (a), 65 parts of the following fluorescent substance (b) (red, green, blue were separately employed) and 75 parts of the following polyhydric alcohol (c).

Resin Composition (A)
Acrylic Polymer (a)
  copolymer of methyl methacrylate, n-butyl methacrylate and methacrylic acid, a ratio of copolymer 30/49/21 based on weight
    (glass transition temperature 69° C., weight average molecular weight 60000, acid number 137 mgKOH/g)

Fluorescent Substance (b)
  $(Y, Gd, Eu)BO_3$ (red)
    (emission wavelength: 593 nm, 610 nm, 626 nm, particle diameter: 2–4 μm, specific gravity: 5.1)
  $(Zn, Mn)_2SiO_4$ (green)
    (emission wavelength: 529 nm, particle diameter: 2–6 μm, specific gravity: 4.2)
  $(Ba, Eu)MgAl_{10}O_{17}$ (blue)
    (emission wavelength: 451 nm, particle diameter: 2–6 μm, specific gravity: 3.8)

Organic Compound (c), Polyhydric Alcohol
  polyethylene glycol
    (viscosity at 20° C.: 170 mPa·sec, weight average molecular weight 600)

The photosensitive resin composition (B) was prepared by using 60 parts of the following base polymer (f), 40 parts of the following ethylenically unsaturated compound (g) and 10 parts of the following photo polymerization initiator (h).

Photosensitive Resin Composition (B)
Base Polymer (f)
  copolymer of methyl methacrylate, n-butyl methacrylate, 2-ethylhexyl acrylate and methacrylic acid, a ratio of copolymer 50/15/10/25 based on weight
    (glass transition temperature 75° C., weight average molecular weight 60000, acid number 163 mgKOH/g)

| Unsaturated compound (g) | |
|---|---|
| tetraethylene glycol dimethacrylate | 25 parts |
| trimethylolpropane triacrylate | 15 parts |
| Photo polymerization initiator (h) | |
| benzyl dimethyl ketal | |

The resin composition (A) layer having 50 μm thickness ($T_a$) was prepared in the same manner as in Example 1 (a protecting film was not covered). In case of the resin composition (A) layer, the layers containing red, green, or blue fluorescent substance were respectively prepared. The photosensitive resin composition (B) layer having 70 μm thickness ($T_b$) was prepared by using the photosensitive resin composition (B) in the same manner as mentioned above (a protecting film was not covered).

By using the obtained laminate of (A) layer and (B) layer, the pattern of the fluorescent substance was formed, exposed, developed and baked in the same manner as in Example 1.

The obtained cell substrate having the formed pattern of fluorescent substances had no defect of pattern made by baking, and it was found by observing a cross section of the cell with SEM (Scanning Electron Microscope) that the fluorescent substance was formed effectively and uniformly from the upper to the bottom part of the wall.

Example 4

The pattern of the fluorescent substance was formed in the same manner as in Example 3 except for changing the composition of the acrylic polymer in the resin composition (A) to the following composition.
Acrylic Polymer (a)
copolymer of methyl methacrylate, n-butyl methacrylate and methacrylic acid, a ratio of copolymer 50/20/30 based on weight
(glass transition temperature 79.6° C., weight average molecular weight 120000, acid number 195.3 mgKOH/g)

The obtained cell substrate having the formed pattern of fluorescent substance had no defect of pattern made by baking, and the fluorescent substance was formed effectively and uniformly from the upper to the bottom part of the wall same as in Example 1.

Example 5

The pattern of the fluorescent substance was formed in the same manner as in Example 3 except for changing the polyhydric alcohol (c) in the resin composition (A) to the following compound.
Organic Compound (c), Polyhydric Alcohol
compound represented by the following formula (II)
(BA-10glycol, available from Nippon Nyukazai Co.,Ltd.)

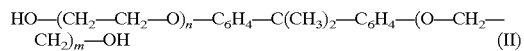

(wherein n and m are a positive integer, and n+m is 10)
(viscosity at 20° C.: 2600 mPa·sec, weight average molecular weight 668)

The obtained cell substrate having the formed pattern of fluorescent substance had no defect of pattern made by baking, and the fluorescent substance was formed effectively and uniformly from the upper part to the bottom of the wall same as in Example 1.

Comparative Example 2

The pattern of the fluorescent substance was formed in the same manner as in Example 3 except for mixing no polyhydric alcohol (c) in the resin composition (A).

The obtained cell substrate having the formed pattern of fluorescent substance did not give an excellent result since it did not have sufficient fluidity due to poor plasticity.

Example 6

The resin composition (A) was prepared by using 50 parts of the following acrylic polymer (a), 65 parts of the following fluorescent substance (b) (red, green, blue were separately employed), 75 parts of the ethylenically unsaturated compound (c) and 2 parts of the photo polymerization inhibitor.

Resin Composition (A)
Acrylic Polymer (a)
copolymer of methyl methacrylate, n-butyl methacrylate and methacrylic acid, a ratio of copolymer 30/49/21 based on weight
(glass transition temperature 69° C., weight average molecular weight 60000, acid number 137 mgKOH/g)
Fluorescent Substance (b)
(Y, Gd, Eu)BO$_3$ (red)
(emission wavelength: 593 nm, 610 nm, 626 nm, particle diameter: 2–4 μm, specific gravity: 5.1)
(Zn, Mn)$_2$SiO$_4$ (green)
(emission wavelength: 529 nm, particle diameter: 2–6 μm, specific gravity: 4.2)
(Ba, Eu)MgAl$_{10}$O$_{17}$ (blue)
(emission wavelength: 451 nm, particle diameter: 2–6 μm, specific gravity: 3.8)
Organic Compound (c), Ethylenically Unsaturated Compound
polyethylene glycol diacrylate
(viscosity at 20° C.: 60 mPa·sec, weight average molecular weight 522)
Photo Polymerization Inhibitor (d)
2,2'-methylenebis(4-methyl-6-tert-butylphenol)

The photosensitive resin composition (B) was prepared by using 60 parts of the following base polymer (f), 40 parts of the following ethylenically unsaturated compound (g) and 10 parts of the following photo polymerization initiator (h).
Photosensitive Resin Composition (B)
Base Polymer (f)
copolymer of methyl methacrylate, n-butyl methacrylate, 2-ethylhexyl acrylate and methacrylic acid, a ratio of copolymer 50/15/10/25 based on weight
(glass transition temperature 75° C., weight average molecular weight 60000, acid number 163 mgKOH/g)

| Unsaturated compound (g) | |
|---|---|
| tetraethylene glycol dimethacrylate | 25 parts |
| trimethylolpropane triacrylate | 15 parts |
| Photo polymerization initiator (h) | |
| benzyl dimethyl ketal | |

The resin composition (A) layer having 50 μm thickness (T$_a$) was prepared in the same manner as in Example 1 (a protecting film was not covered). In case of the resin composition (A) layer, the layers containing red, green, or blue fluorescent substance were respectively prepared. The photosensitive resin composition (B) layer having 70 μm thickness (T$_b$) was prepared by using the photosensitive resin composition (B) in the same manner as mentioned above (a protecting film was not covered).

By using the obtained laminate of (A) layer and (B) layer the pattern of the fluorescent substance was formed, exposed, developed and baked in the same manner as in Example 1.

The obtained cell substrate having the formed pattern of fluorescent substances had no defect of pattern made by baking, and it was found by observing a cross section of the cell with SEM (Scanning Electron Microscope) that the fluorescent substance was formed effectively and uniformly from the upper to the bottom part of the wall.

Example 7

The pattern of the fluorescent substance was formed in the same manner as in Example 6 except for changing the composition of the acrylic polymer in the resin composition (A) to the following composition.

Acrylic Polymer (a)
- copolymer of methyl methacrylate, n-butyl methacrylate and methacrylic acid, a ratio of copolymer 50/20/30 based on weight
  - (glass transition temperature 79.6° C., weight average molecular weight 120000, acid number 195.3 mgKOH/g)

The obtained cell substrate having the formed pattern of fluorescent substance had no defect of pattern made by baking, and the fluorescent substance was formed effectively and uniformly from the upper to the bottom part of the wall same as in Example 1.

Example 8

The pattern of the fluorescent substance was formed in the same manner as in Example 6 except for changing the ethylenically unsaturated compound (c) to the following compound represented by the following formula (III).

Ethylenically Unsaturated Compound (c)

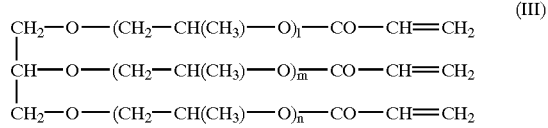

(wherein l, m and n are a positive integer, and n+m is about 3.9)

(OTA-480, available from Dicel UCB Kabusikigaisya)

(viscosity at 20° C.: 150 mPa·sec, weight average molecular weight 480)

The obtained cell substrate having the formed pattern of fluorescent substance had no defect of pattern made by baking, and the fluorescent substance was formed effectively and uniformly from the upper to the bottom part of the wall same as in Example 1.

Comparative Example 3

The pattern of the fluorescent substance was formed in the same manner as in Example 6 except for mixing no ethylenically unsaturated compound (c) in the resin composition (A).

The obtained cell substrate having the formed pattern of fluorescent substance had some defects since it did not have sufficient following property.

The process for forming a pattern of fluorescent substance of the present invention is excellent in filling up property into the cell, and is useful for the application of fluorescent substance formation due to the no defect of pattern at baking and the effective and uniform formation of fluorescent substance pattern on the side and bottom wall of the cell, since there are filled the resin composition (A) layer containing a fluorescent substance, which is not photosensitive, and the photosensitive resin composition (B) layer containing no fluorescent substance in the cell.

What is claimed is:

1. A process for forming a pattern of fluorescent substance into the cell of a fluorescent substance display substrate comprising providing inside the cell two separate layers which are (i) a resin composition (A) layer and (ii) a photosensitive resin composition (B) layer, exposing the layers to light, developing the exposed layers, and baking the developed layers; wherein the resin composition (A) layer is not photosensitive and consists essentially of an acrylic polymer (a) having a weight average molecular weight of 10000 to 300000 and an acid number of 80 to 250 mgKOH/g, a fluorescent substance (b), a compound containing at least one ethylenically unsaturated group (c) having a viscosity of 5–15000 mPa.sec at 20° C., and 0.1 to 15 parts by weight of a polymerization inhibitor (d) based on 100 parts by weight of the acrylic polymer (a), the resin composition (A) layer is disposed between the inside of the cell and the photosensitive resin composition (B) layer, and the photosensitive resin composition (B) comprises a photoinitiator.

2. A process for forming a pattern of fluorescent substance into the cell of a fluorescent substance display substrate, wherein a resin composition (A) layer, being non-photosensitive and consisting essentially of an acrylic polymer (a) having a weight average molecular weight of 10000 to 300000 and an acid number of 80 to 250 mgKOH/g, a fluorescent substance (b), a compound containing at least one ethylenically unsaturated group (c) having a viscosity of 5–15000 mPa.sec at 20° C., and 0.1 to 15 parts by weight of a polymerization inhibitor (d) based on 100 parts by weight of the acrylic polymer (a), and a photosensitive resin composition (B) layer are formed inside the cell, and then they are exposed, developed and baked, wherein the photosensitive resin composition (B) layer is formed in the cell after the resin composition (A) layer is formed, and the photosensitive resin composition (B) comprises a photoinitiator.

3. A process for forming a pattern of fluorescent substance into the cell of a fluorescent substance display substrate comprising providing inside the cell two separate layers which are (i) a resin composition (A) layer and (ii) a photosensitive resin composition (B) layer, wherein the resin composition (A) layer, being non-photosensitive and consisting essentially of an acrylic polymer (a) having a weight average molecular weight of 10000 to 300000 and an acid number of 80 to 250 mgKOH/g, a fluorescent substance (b), a compound containing at least one ethylenically unsaturated group (c) having a viscosity of 5–15000 mPa.sec at 20° C., and 0.1 to 15 parts by weight of a polymerization inhibitor (d) based on 100 parts by weight of an acrylic polymer (a), the photosensitive resin composition (B) comprises a photoinitiator and the photosensitive resin composition (B) layer are formed inside the cell, and then they are exposed, developed and baked, wherein the photosensitive resin composition (B) layer is formed in the cell after the resin composition (A) layer is formed.

* * * * *